US008937319B2

(12) United States Patent
Maeyama et al.

(10) Patent No.: US 8,937,319 B2
(45) Date of Patent: Jan. 20, 2015

(54) SCHOTTKY BARRIER DIODE

(75) Inventors: Yusuke Maeyama, Iruma (JP); Ryohei Osawa, Tokorozawa (JP); Yoshitaka Araki, Nishimurayama-gun (JP); Yoshiyuki Watanabe, Iruma (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/410,542

(22) Filed: Mar. 2, 2012

(65) Prior Publication Data

US 2012/0228636 A1   Sep. 13, 2012

(30) Foreign Application Priority Data

Mar. 7, 2011 (JP) ................. 2011-049621

(51) Int. Cl.
*H01L 29/872* (2006.01)
*H01L 29/06* (2006.01)
*H01L 29/16* (2006.01)

(52) U.S. Cl.
CPC .......... *H01L 29/872* (2013.01); *H01L 29/0619* (2013.01); *H01L 29/1608* (2013.01)
USPC .............. 257/77; 257/472; 257/484; 438/572

(58) Field of Classification Search
USPC ................ 257/450, 54, 77, 483, 484
See application file for complete search history.

(56) References Cited

U.S. PATENT DOCUMENTS

| | | | | |
|---|---|---|---|---|
| 4,607,270 A * | 8/1986 | Iesaka | ............... | 257/484 |
| 5,017,976 A * | 5/1991 | Sugita | ............... | 257/494 |
| 6,340,836 B1 * | 1/2002 | Shikata | ............... | 257/544 |
| 6,426,541 B2 * | 7/2002 | Chang et al. | ............... | 257/472 |
| 6,465,874 B2 * | 10/2002 | Nemoto | ............... | 257/653 |
| 6,831,345 B2 * | 12/2004 | Kinoshita et al. | ............... | 257/492 |
| 6,861,723 B2 * | 3/2005 | Willmeroth | ............... | 257/471 |
| 7,034,376 B2 * | 4/2006 | Okada et al. | ............... | 257/471 |
| 7,101,739 B2 * | 9/2006 | Lanois | ............... | 438/141 |
| 7,141,861 B2 * | 11/2006 | Takayama | ............... | 257/485 |

(Continued)

FOREIGN PATENT DOCUMENTS

| | | |
|---|---|---|
| EP | 0 703 627 | 3/1996 |
| JP | 04-212468 | 8/1992 |

(Continued)

OTHER PUBLICATIONS

European Search Report issued in EP Application No. 12158048.4 on Mar. 27, 2014.

(Continued)

*Primary Examiner* — Olik Chaudhuri
*Assistant Examiner* — Charles N Ausar-El
(74) *Attorney, Agent, or Firm* — Nixon & Vanderhye P.C.

(57) ABSTRACT

A third insulating layer is formed in a periphery region of a substrate over a first surface (main surface) of the substrate so as to straddle a second semiconductor layer closest to a guard ring layer and a second semiconductor layer closest to the second semiconductor layer. In other words, the third insulating layer is formed to cover a portion of the first semiconductor layer, which is exposed to the first surface (main surface) of the substrate and which is between the second semiconductor layers. Thereby, the third insulating layer electrically insulates the metal layer from the portion of the first semiconductor layer, which is exposed to the first surface (main surface) of the substrate and which is between the second semiconductor layers.

8 Claims, 3 Drawing Sheets

(56) References Cited

U.S. PATENT DOCUMENTS

| | | | |
|---|---|---|---|
| 7,791,308 B2 * | 9/2010 | Kitabatake et al. | 318/801 |
| 7,851,881 B1 * | 12/2010 | Zhao et al. | 257/471 |
| 7,851,882 B2 * | 12/2010 | Okuno et al. | 257/472 |
| 2004/0061195 A1 * | 4/2004 | Okada et al. | 257/477 |
| 2005/0029615 A1 * | 2/2005 | Tanaka et al. | 257/484 |
| 2005/0139947 A1 * | 6/2005 | Okada et al. | 257/480 |
| 2005/0184406 A1 * | 8/2005 | Okada et al. | 257/928 |
| 2005/0194610 A1 * | 9/2005 | Souma et al. | 257/133 |
| 2005/0242411 A1 * | 11/2005 | Tso | 257/480 |
| 2007/0278672 A1 | 12/2007 | Tooi et al. | |
| 2008/0006899 A1 * | 1/2008 | Kim et al. | 257/476 |
| 2008/0277668 A1 * | 11/2008 | Okuno et al. | 257/77 |
| 2008/0296587 A1 * | 12/2008 | Yamamoto et al. | 257/77 |
| 2009/0008651 A1 * | 1/2009 | Okuno et al. | 257/77 |
| 2010/0032730 A1 | 2/2010 | Endo et al. | |
| 2010/0244049 A1 * | 9/2010 | Yamamoto et al. | 257/77 |
| 2010/0289110 A1 * | 11/2010 | Tarui et al. | 257/490 |
| 2011/0175106 A1 * | 7/2011 | Mizukami et al. | 257/77 |

FOREIGN PATENT DOCUMENTS

| | | |
|---|---|---|
| JP | 3708057 | 10/2005 |
| JP | 2010-225878 | 10/2010 |

OTHER PUBLICATIONS

Peters et al., "1700 B SiC Schottky Diodes Sealed to 25 A", *Materials Science Forum*, vols. 335-336, 2001, pp. 675-678.

Treu et al., "A Surge Current Stable and Avalanche Rugged SiC Merged pn Schottky Diode Blocking 600V Especially Suited for PFC Applications", *Materials Science Forum*, vols. 527-529, 2006, pp. 1155-1158.

* cited by examiner

SCHOTTKY BARRIER DIODE

BACKGROUND OF THE INVENTION

1. Field of the Invention

The present invention relates to a schottky barrier diode. Particularly, the present invention relates to technology of improving the reverse surge capacity of a schottky barrier diode.

Priority is claimed on Japanese Patent Application No. 2011-049621, filed Mar. 7, 2011, the content of which is incorporated herein by reference.

2. Description of the Related Art

Schottky barrier diodes (hereinafter referred to as "SBD") are semiconductor elements using rectification behavior of schottky barrier caused by schottky junction between a semiconductor layer and a metal layer. The SBDs are characterized by faster operation and smaller forward voltage drop than general p-n junction diodes.

Regarding switching power sources including such SBDs, reverse voltage applied in a direction from an n-type semiconductor layer to a metal layer exceeds the upper voltage limit of the SBD (hereinafter referred to as "reverse surge capacity") in some cases, such as in a case of emergency stop in emergency situations. If the reverse voltage exceeds the reverse surge capacity, the SBD might break down.

As an example of diodes improving the reverse surge capacity, diodes having such a junction barrier schottky (hereinafter referred to as "JBS") structure as shown in FIG. 4 are well known.

FIG. 4 illustrates an example of a JBS diode of related art. A JBS diode 100 includes: an n-type semiconductor layer 102 formed on a surface of a semiconductor substrate 101 made of silicon carbide (SiC) or the like; and a metal layer 103 forming a schottky junction with the n-type semiconductor layer 102. Additionally, an insulating layer 104 is formed over the n-type semiconductor layer 102 so as to extend outward from a periphery region of the metal layer 103. Further, a guard ring layer 105 is formed in the n-type semiconductor layer 102 so as to overlap a connecting portion between the metal layer 103 and the insulating layer 104, that is, a periphery region of the insulating layer 104. The guard ring layer 105 is formed by ion implantation of an impurity into the n-type semiconductor layer 102. The guard ring layer 105 reduces field concentration which occurs in a peripheral region of the n-type semiconductor layer 102 and the metal layer 103 that form the schottky junction.

On the other hand, the JBS structure is formed inside the guard ring layer 105, that is, in a center region. For example, multiple second semiconductor layers 106 made of a p-type semiconductor are formed at a predetermined interval, inside the guard ring layer 105. The second semiconductor layers 106, which form p-n junction with the n-type semiconductor layer 102, are designed so as to be lower in voltage than the portion of the schottky junction between the n-type semiconductor layer 102 and the metal layer 103, and the insulating layer 104 therearound. Accordingly, the load of reverse current (reverse surge) is induced on the JBS diode including the second semiconductor layers 106, thereby improving the reverse surge capacity of the schottky junction portion (see, for example, Material Science Forum Vols. 527-529 (2006), pp 1155-1158).

Regarding the aforementioned JBS diode of the related art, however, the p-type second semiconductor layers are disposed close to the portion of the schottky junction between the n-type semiconductor layer and the metal layer. For this reason, a depletion layer extends from the schottky junction portion along the second semiconductor layers. Thereby, it is difficult to sufficiently reduce the voltage of the second semiconductor layers. Consequently, field concentration in the peripheral region is not actually reduced for the SBD having such a JBS structure as that of the related art. Therefore, the reverse surge capacity is not improved.

SUMMARY

A schottky barrier diode according to one embodiment of the present invention may include, but is not limited to: a substrate including silicon carbide; a first semiconductor layer included in the substrate, the first semiconductor layer being adjacent to a first surface of the substrate, and the first semiconductor layer including an n-type semiconductor; a metal layer forming schottky junction with the first semiconductor layer; a first insulating layer contacting a periphery region of the metal layer and extending outward; a guard ring layer in the first semiconductor layer, the guard ring layer being along the periphery region in which the first insulating layer contacts the metal layer, and the guard ring layer including a p-type semiconductor; a plurality of second semiconductor layers in the first semiconductor layer, the plurality of second semiconductor layers being arranged at a first interval in a direction from the guard ring layer toward a center region of the substrate; a second insulating layer on the first surface of the substrate, the second insulating layer being disposed between the guard ring layer and one of the plurality of second semiconductor layers which is the closest to the guard ring layer; and a third insulating layer on the first surface of the substrate, the third insulating layer being disposed between two adjacent second semiconductor layers of the plurality of second semiconductor layers.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a schottky barrier diode in the embodiments. The size, the thickness, and the like of each illustrated portion might be different from those of each portion of an actual schottky barrier diode.

Those skilled in the art will recognize that many alternative embodiments can be accomplished using the teachings of the present invention and that the present invention is not limited to the embodiments illustrated herein for explanatory purposes.

Figure 1A:
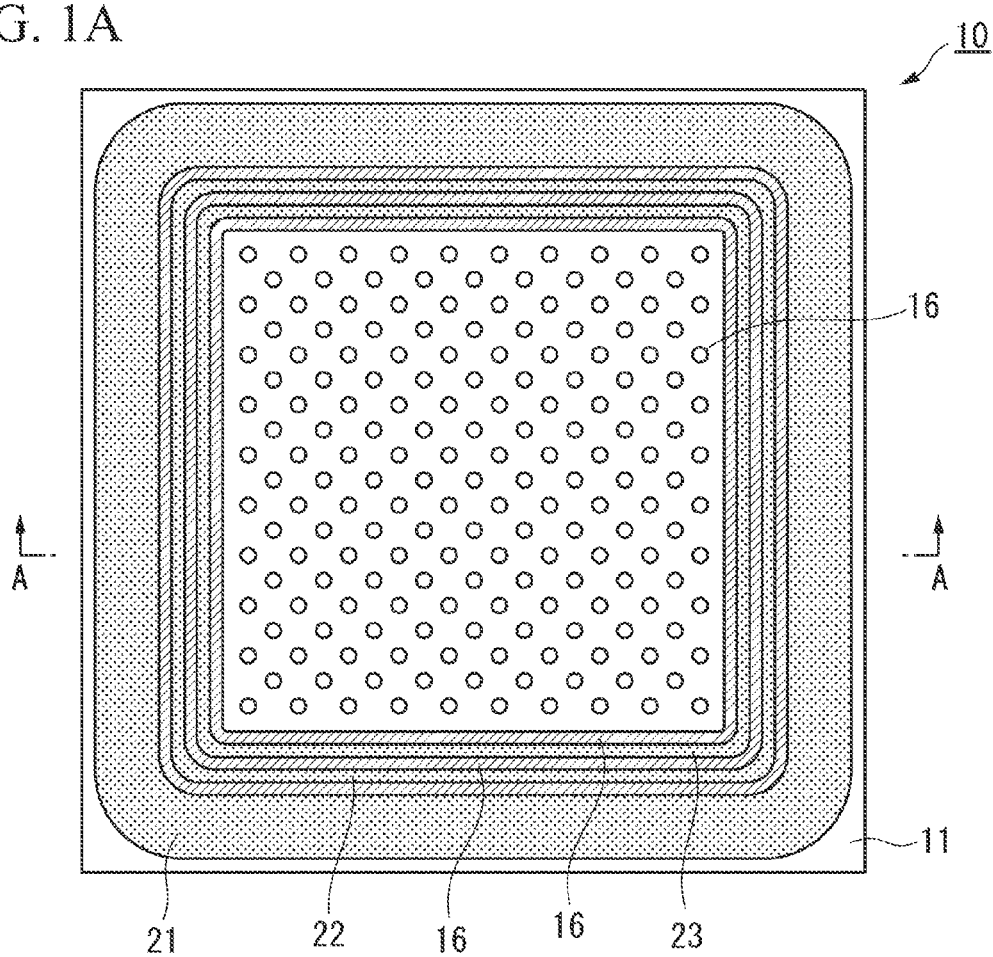
FIG. 1A is a plan view illustrating a schottky barrier diode according to an embodiment of the present invention.
Figure 1B:
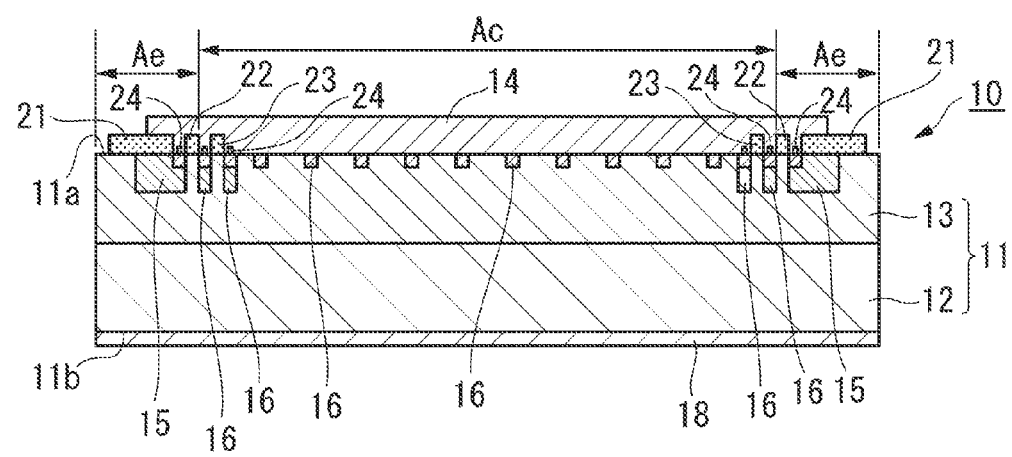
FIG. 1B is a cross-sectional view taken along line A-A shown in FIG. 1A.

FIG. 1A is a plan view illustrating a schottky barrier diode according to an embodiment of the present invention. FIG. 1B is a cross-sectional view taken along line A-A shown in FIG. 1A.

A schottky barrier diode (hereinafter referred to as "diode") 10 according to the present embodiment includes a substrate 11 made of silicon carbide (SiC). The substrate 11 includes a high concentration semiconductor layer (n-type region) 12 and a first semiconductor layer 13 over the high concentration semiconductor layer 12. The high concentration semiconductor layer 12 is made of, for example, an $n^+$-type SiC containing a high concentration impurity. The first semiconductor layer 13 is made of, for example, an $n^-$-type SiC containing a low concentration impurity. Hereinafter, one of the two opposing surfaces of the substrate 11, which is adjacent to the first semiconductor layer ($n^-$-type SiC layer) 13, is referred to as a first surface (main surface) 11a. Additionally, the other one of the two opposing surfaces of the substrate 11, which is adjacent to the high concentration layer ($n^+$-type SiC layer) 12, is referred to as a second surface (other main surface) 11b.

A metal layer (schottky electrode) 14 is formed over the first surface (main surface) 11a of the substrate 11 so as to form schottky junction with the first semiconductor layer 13. The metal layer 14 is made of a metal substance, such as Mo (molybdenum) or Ti (titanium). Additionally, the metal layer 14 is formed over a region of the first surface 11a of the substrate 11, which is surrounded by a first insulating film 21 which will be explained later. A periphery region of the metal layer 14 partially overlaps the first insulating layer 21.

The first insulating layer 21 is formed over the first surface (main surface) 11a of the substrate 11 so as to contact the periphery region of the metal layer 14 and extend outward. The first insulating layer 21 may be made of a silicon oxide film or the like and be made in ring shape.

A guard ring layer (p-type reduced-surface layer) 15 is formed in a periphery region Ae of the substrate 11 where the first insulating film 21 contacts the metal layer 14. The guard ring 15 is made of a p-type semiconductor and has a ring shape in plan view (i.e., when viewed in a direction perpendicular to the first semiconductor layer 13). The guard ring layer 15 may contain an impurity, such as aluminum (Al) or boron (B). The first insulating layer 21 covers a periphery portion of the guard ring 15 in ring shape. The internal portion of the guard ring 15 is not covered by the first insulating layer 21 and contacts the metal layer 14.

Multiple second semiconductor layers 16 made of a p-type semiconductor are formed in the first semiconductor layer 13. The second semiconductor layers are arranged at a predetermined interval (first interval) in a direction from the guard ring layer 15 toward a center region Ac of the substrate 11 which is inside the guard ring layer 15.

By the structure explained above, the metal layer 14 contacts the surface of the first semiconductor layer 13 made of an $n^-$-type SiC, the second semiconductor layers 16 made of a p-type semiconductor, and the guard ring layer 15 made of a p-type semiconductor. Additionally, the metal layer 14 is in schottky contact with the first semiconductor layer 13. Further, the metal layer 14 is in ohmic contact with an ohmic layer 24, the second semiconductor layers 16, and the guard ring layer 15. The ohmic layer 24 is formed by annealing Ni (nickel), Ti (titanium), Al (aluminum), or the like.

On the other hand, an ohmic electrode 18 is formed on the second surface (other main surface) 11b of the substrate 11 so as to overlap the high concentration semiconductor layer 12. The ohmic electrode 18 is made of a metal substance, such as Ni, Ti, or the like. The ohmic electrode 18 is in ohmic contact with the high concentration semiconductor layer 12 made of an $n^+$-type SiC.

Figure 2:
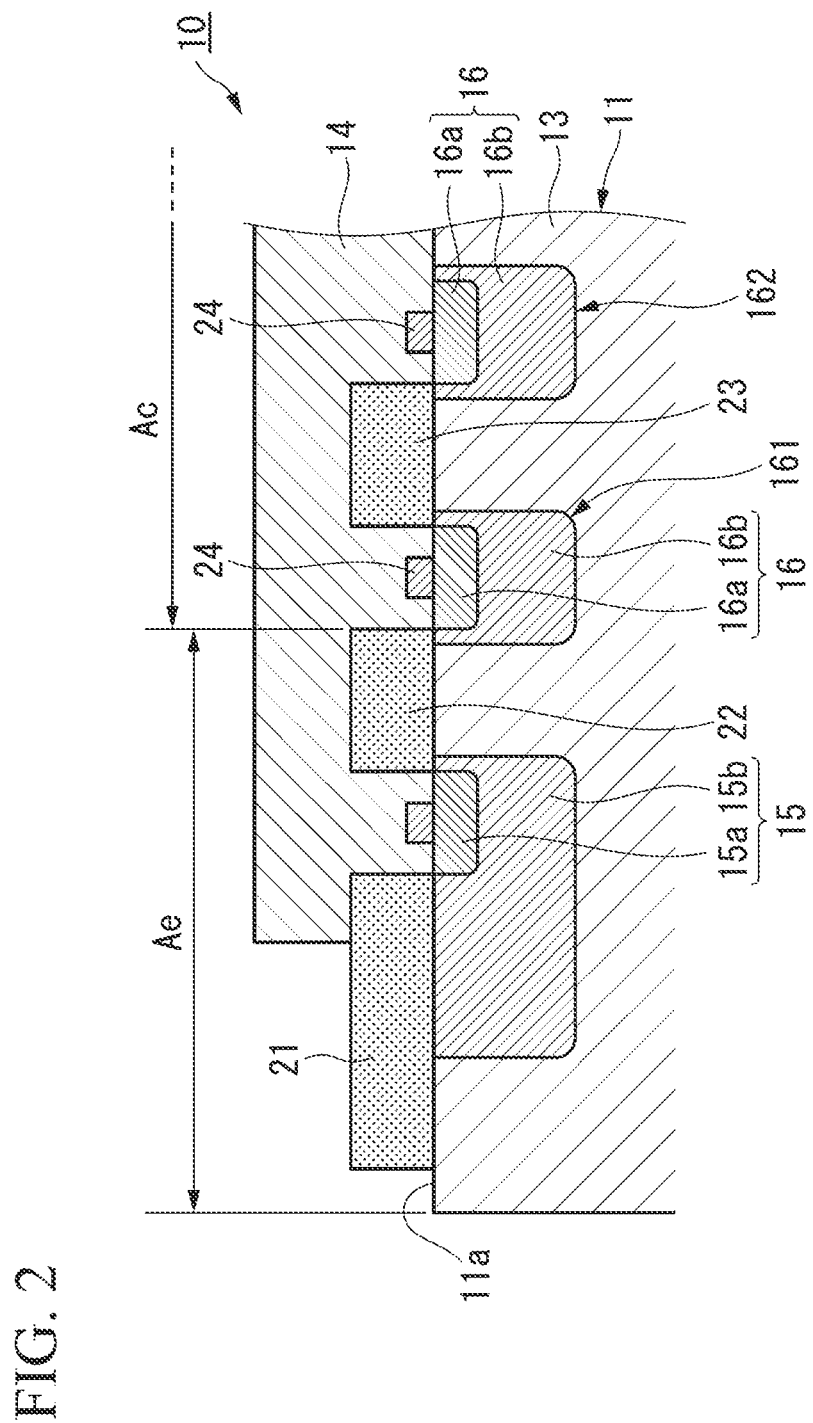
FIG. 2 is a partially-enlarged cross-sectional view illustrating a boundary region between a peripheral region and a center region.

FIG. 2 is a cross-sectional view partially enlarging a portion ranged from the periphery region of the diode to the center region.

The guard ring layer 15 includes, for example, a $P^+$-type region 15a and a $P^-$-type region 15b covering the outer periphery of the $P^+$-type region 15a. Among the second semiconductor layers 16 arranged at the predetermined interval (first interval) in a direction from the guard ring 15 toward the center region Ac of the substrate 11 inside the guard ring layer 15, for example, each of second semiconductor layers 161 and 162 which are close to the guard ring layer 15 includes a $P^+$-type region 16a and a $P^-$-type region 16b covering the outer periphery of the $P^+$-type region 16a, similarly to the guard ring layer 15.

The ohmic electrode 24 is formed over the first surface (main surface) 11a of the substrate 11 so as to contact the $P^+$-type region 15a included in the guard ring layer 15. The ohmic electrode 24 may be formed by annealing Ni, Ti, Al, or the like.

Additionally, additional ohmic electrodes 24 are formed over the first surface (main surface) 11a of the substrate 11 so as to contact the respective $P^+$-type regions 16a included in the second semiconductor layers 16. These ohmic electrodes 24 may be formed by annealing Ni, Ti, Al, or the like.

A second insulating layer 22 is formed in the periphery region Ae of the substrate 11 over the first surface (main surface) 11a of the substrate 11 so as to straddle at least the guard ring layer 15 and the second semiconductor layer 161 closest to the guard ring layer 15. In other words, the second insulating layer 22 is formed to cover a portion of the first semiconductor layer 13, which is exposed to the first surface (main surface) 11a of the substrate 11 and which is between the guard ring layer 15 and the second semiconductor layer 161 closest to the guard ring layer 15.

Additionally, a third insulating layer 23 is formed in the periphery region Ac of the substrate 11 over the first surface (main surface) 11a of the substrate 11 so as to straddle the second semiconductor layer 161 closest to the guard ring layer 15 and the second semiconductor layer 162 closest to the second semiconductor layer 161. In other words, the third insulating layer 23 is formed to cover a portion of the first semiconductor layer 13, which is exposed to the first surface (main surface) 11a of the substrate 11 and which is between the second semiconductor layers 161 and 162. Thereby, the third insulating layer 23 electrically insulates the metal layer 14 from the portion of the first semiconductor layer 13, which is exposed to the first surface (main surface) 11a of the substrate 11 and which is between the second semiconductor layers 161 and 162.

It is preferable that the second insulating layer 22 also covers a portion of the $P^-$-type region 15b of the guard ring layer 15 and a portion of the $P^-$-type region 16b of the second semiconductor layer 161, which are exposed to the first surface (main surface) 11a of the substrate 11.

Similarly, it is preferable that the third insulating layer 23 also covers a portion of the $P^-$-type region 16b of the second semiconductor layer 161 and a portion of the $P^-$-type region 16b of the second semiconductor layer 162, which are exposed to the first surface (main surface) 11a of the substrate 11.

The second insulating layer 22 and the third insulating layer 23 may be made of a silicon oxide film or the like, and be made in ring shape. Alternatively, the second insulating layer 22 and the third insulating layer 23 may be made of a dielectric material, such as a metal oxide or a resin.

Additionally, as shown in FIG. 1A, the first insulating layer 21 surrounds the second insulating layer 22 in plan view. The second insulating layer 22 surrounds the third insulating layer 23 in plan view.

Further, multiple third insulating layers 23 may be formed so that each of the third insulating layers 23 is disposed between two adjacent second semiconductor layers 16.

Moreover, the first insulating layer 21, the second insulating layer 22, and the third insulating layer 23 may have a structure formed by patterning an insulator uniformly formed over the first semiconductor layer 13.

Hereinafter, operation of the diode 10 of the embodiment which has the above structure is explained.

The guard ring layer 15 made of a p-type semiconductor reduces field concentration occurring in the periphery region Ae where the metal layer 14 and the first semiconductor layer 13 made of an n-type semiconductor form the schottky junction.

On the other hand, the semiconductor layers 16, which are formed at the predetermined interval inside the guard ring layer 15 (i.e., in the center region Ac) and form the p-n junction with the first semiconductor layer 13, are designed to be lower in voltage than the portion of the schottky junction between the first semiconductor layer 13 and the metal layer 14, and the first insulating layer 21 therearound. Thereby, the load of reverse current (reverse surge) is induced on the p-n junction between the second semiconductor layers 16 and the first semiconductor layer 13, thereby improving the reverse surge capacity.

Additionally, the diode 10 of the embodiment prevents, by the second insulating layer 22 and the third insulating layer 23, a depletion layer from extending from the portion of the schottky junction between the first semiconductor layer 13 and the metal layer 14, along the side surfaces of the second semiconductor layers 161 and 162, that are, the P⁻-type regions 16b included in the second semiconductor layers 161 and 162.

In other words, regarding the diode 10 having the JBS structure, if a depletion layer extends from the portion of the schottky junction between the first semiconductor layer 13 and the metal layer 14, the field concentration on the periphery region of the diode is not reduced, and therefore the reverse surge capacity is not improved. However, thanks to the second insulating layer 22 formed between the guard ring layer 15 and the second semiconductor layer 161 closest to the guard ring layer 15, and the third insulating layer 23 formed between the second semiconductor layer 161 and the second semiconductor layer 162 closest to the second semiconductor layer 161, a depletion layer is prevented from extending along the P⁻-type regions 16b included in the second semiconductor layers 161 and 162.

Particularly, the second insulating layer 22 and the third insulating layer 23 are formed so as to partially cover the P⁻-type region 16b included in the second semiconductor layer 16, thereby reliably preventing a depletion layer from extending along the P⁻-type region 16b.

Accordingly, the reverse surge capacity is significantly improved at the portion of the schottky junction between the first semiconductor layer 13 and the metal layer 14. For example, even if a reverse voltage applied in a direction from the first semiconductor layer 13 toward the metal layer 14 is generated, the extension of a depletion layer is prevented by the second and third insulating layers 22 and 23. Consequently, the electric field concentrates on the second semiconductor layer 16, and the voltage of the p-n junction between the first and second semiconductor layers 13 and 16 decreases. Thereby, the load of reverse current (reverse surge) is induced on the p-n-junction. For this reason, the reverse surge capacity is increased, thereby preventing breakdown of the diode 10.

Example

Hereinafter, an example of verifying the effect of the present invention is explained.

A JBS diode having the structure shown in "Material Science Forum Vols. 353-356 (2000), pp 675-678" was used in a first comparison example. A JBS diode having both the structure shown in the Japanese Patent Publication No. 3708057 and the structure shown in Material Science Forum Vols. 527-529 (2006), pp 1155-1158 was used in a second comparison example. The diode 10 shown in FIG. 1 according to the embodiment of the present invention was used in the present example. Then, the reverse surge capacity was measured in each of the comparison examples 1 and 2, and the present example. The results of the verification are shown in FIG. 3.

Figure 3:
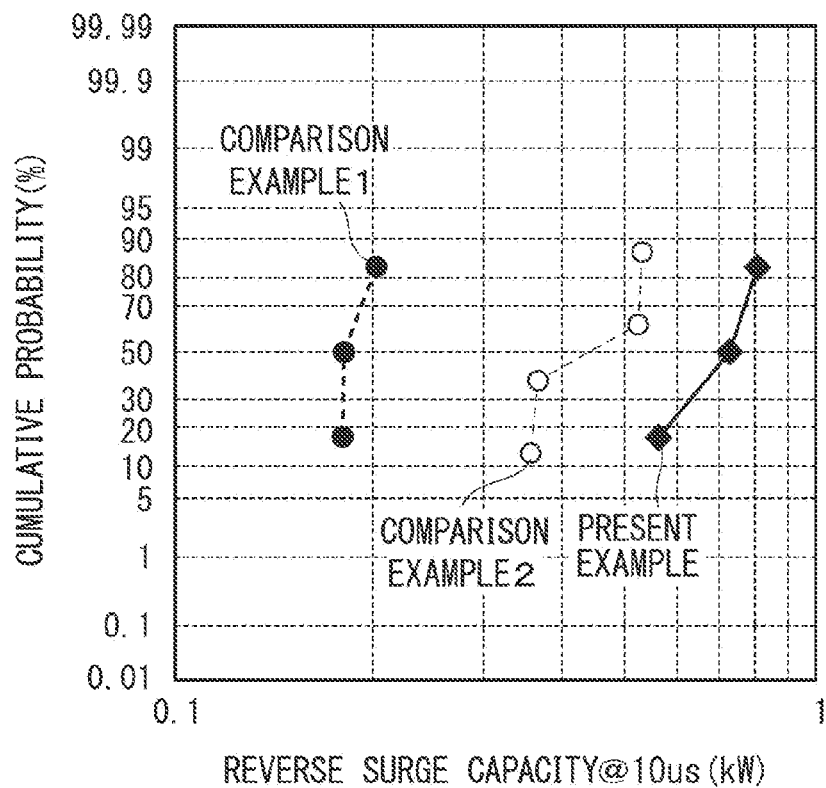
FIG. 3 is a graph illustrating the results of verification according to an example of the present invention.
Figure 4:
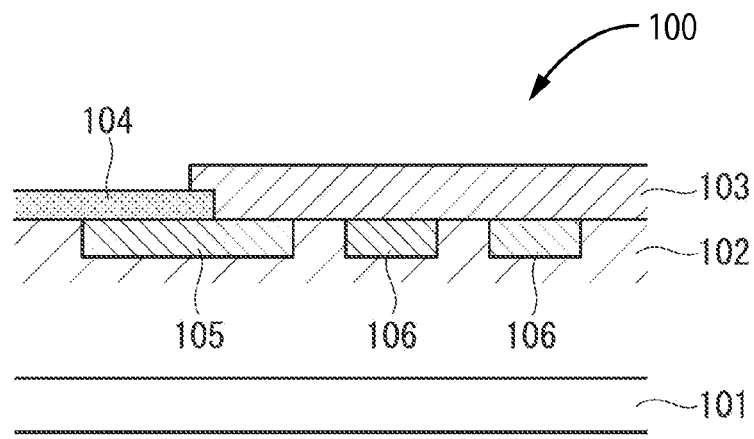
FIG. 4 is a cross-sectional view illustrating an example of a schottky barrier diode of related art.

According to the results of the verification shown in FIG. 3, it was confirmed that the reverse surge capacity of the diode according to the embodiment of the present invention was significantly improved compared to the JBS diodes of the comparison examples 1 and 2, which were the diodes of the related art.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

What is claimed is:

1. A schottky barrier diode comprising:
   a substrate including silicon carbide, the substrate having a center region and a periphery region surrounding the center region in plan view;
   a first semiconductor layer included in the substrate, the first semiconductor layer being adjacent to a first surface of the substrate, and the first semiconductor layer including an n-type semiconductor;
   a metal layer extending over the center and peripheral regions and forming schottky junction with the first semiconductor layer;
   a first insulating layer contacting the metal layer in the periphery region in extending over the periphery region of the substrate;
   a guard ring layer in the first semiconductor layer, the guard ring layer being in the periphery region in plan view, the guard ring layer contacting the metal layer in the periphery region of the substrate, and the guard ring layer being a p-type semiconductor layer;
   a plurality of second semiconductor layers in the first semiconductor layer, the plurality of second semiconductor layers being p-type semiconductor layers, the plurality of second semiconductor layers being in the center region, the plurality of second semiconductor layers including a first layer, a second layer, and remaining layers, the first layer being closest to the guard ring layer among the plurality of second semiconductor layers, the second layer being closest to the first layer among the plurality of second semiconductor layers, the first layer being between the guard ring layer and the second layer, the second layer surrounding the remaining layers, the first layer surrounding the second layer, the guard ring layer surrounding the first layer, and the remaining layers being arranged at a first interval in the center region of the substrate, each of the plurality of second semiconductor layers being separated from one another, and the remaining layers of the plurality of second semiconductor layers having no common center;
a second insulating layer on the first surface of the substrate, the second insulating layer covering the first layer of the substrate between the guard ring layer and the first layer; and
a third insulating layer on the first surface of the substrate, the third insulating layer covering the first surface of the substrate between the first and second layers,
wherein the guard ring layer, the first and second layesr, and the first to third insulating layers extend along a boundary between the center and periphery regions in plan view.

2. The schottky barrier diode according to claim 1, wherein each of the plurality of second semiconductor layers comprises a $P^+$-type semiconductor layer and a $P^-$-type semiconductor region.

3. The schottky barrier diode according to claim 1, wherein the first insulating layer, the second insulating layer, and the third insulating layer have a structure formed by patterning an insulator uniformly formed over the first semiconductor layer.

4. The schottky barrier diode according to claim 1, wherein the first insulating layer includes an oxide of a semiconductor.

5. The schottky barrier diode according to claim 1, further comprising:
an ohmic electrode on the first surface of the substrate, the ohmic electrode contacting any one of the guard ring layer, the first layer and the second layer.

6. The schottky barrier diode according to claim 1, wherein the second insulating layer surrounds the third insulating layer in plan view, and the first insulating layer surrounds the second insulating layer in plan view.

7. The schottky barrier diode according to claim 1, wherein the first insulating layer paritally covers the guard ring layer in the peripheral region.

8. The schottky barrier diode according to claim 1, wherein the guard ring layer and the first and second layers are larger in the vertical dimension than the remaining layers, and the guard ring layer is substantially the same in the vertical dimension as the first and second layers.

\* \* \* \* \*